United States Patent
Hamaguchi et al.

(10) Patent No.: US 8,698,188 B2
(45) Date of Patent: Apr. 15, 2014

(54) SEMICONDUCTOR LIGHT EMITTING DEVICE AND METHOD FOR PRODUCING THE SAME

(75) Inventors: Yasutaka Hamaguchi, Komatsushima (JP); Yoshiki Inoue, Anan (JP); Takahiko Sakamoto, Anan (JP)

(73) Assignee: Nichia Corporation, Anan-shi (JP)

( * ) Notice: Subject to any disclaimer, the term of this patent is extended or adjusted under 35 U.S.C. 154(b) by 67 days.

(21) Appl. No.: 13/260,240

(22) PCT Filed: Mar. 5, 2011

(86) PCT No.: PCT/JP2011/055149
§ 371 (c)(1),
(2), (4) Date: Sep. 23, 2011

(87) PCT Pub. No.: WO2011/111642
PCT Pub. Date: Sep. 15, 2011

(65) Prior Publication Data
US 2012/0032225 A1    Feb. 9, 2012

(30) Foreign Application Priority Data
Mar. 8, 2010  (JP) .................... 2010-050070

(51) Int. Cl.
*H01L 33/54*  (2010.01)
*H01L 21/66*  (2006.01)
*H01L 33/62*  (2010.01)

(52) U.S. Cl.
USPC ............. 257/99; 257/E33.059; 257/E33.066; 257/E21.531; 438/17; 438/26

(58) Field of Classification Search
USPC .......................................... 257/79–103, 772
See application file for complete search history.

(56) References Cited

U.S. PATENT DOCUMENTS

| 6,998,649 B2 * | 2/2006 | Hata ................................ 257/99 |
| 2005/0212002 A1 * | 9/2005 | Sanga et al. .................... 257/96 |

(Continued)

FOREIGN PATENT DOCUMENTS

| JP | 10-325844 A | 8/1998 |
| JP | 2000-077790 A | 3/2000 |

(Continued)

OTHER PUBLICATIONS

Search Report mailed May 31, 2011 in International Appln. No. PCT/JP2011/055149.

(Continued)

*Primary Examiner* — Marc Armand
*Assistant Examiner* — Quinton Brasfield
(74) *Attorney, Agent, or Firm* — Foley & Lardner LLP (57) ABSTRACT

The object of the invention is to improve the visual inspection yield of a semiconductor light emitting device. To achieve the object, a semiconductor light emitting device includes a semiconductor layer, a pad electrode on the layer, and a protection film covering at least the layer. The device includes at least one stopper arranged on a peripheral part of the pad electrode surface away from the film. The stopper has a semicircular arc shape opening toward the center of the pad electrode. In electrical/optical property inspection, if sliding on the pad electrode, a probe needle can be guided into the concave surface of the semicircular arc shape. The stopper can reliably hold the needle. It is avoidable that the needle contacts the film. It is preferable that each of positive/negative electrodes have the pad electrode, and a pair of stoppers be arranged in positions on the electrodes facing each other.

15 Claims, 6 Drawing Sheets

(56) References Cited

U.S. PATENT DOCUMENTS

| | | | |
|---|---|---|---|
| 2006/0017061 A1* | 1/2006 | Sakamoto et al. | ............ 257/103 |
| 2008/0197353 A1* | 8/2008 | Takahashi et al. | .............. 257/48 |
| 2008/0290365 A1 | 11/2008 | Sakamoto et al. | |
| 2009/0184329 A1 | 7/2009 | Miki et al. | |
| 2012/0097922 A1 | 4/2012 | Masuya et al. | |

FOREIGN PATENT DOCUMENTS

| | | |
|---|---|---|
| JP | 2004-281581 A | 7/2004 |
| JP | 2005-108982 A | 4/2005 |
| JP | 2005-158788 A | 6/2005 |
| JP | 2006-114812 A | 4/2006 |
| JP | 2006-066903 A | 9/2006 |
| TW | 201110413 A1 | 3/2011 |
| WO | WO-2005/096399 A1 | 10/2005 |

OTHER PUBLICATIONS

Office Action for corresponding Taiwan Patent Application No. 10221463420 dated Oct. 28, 2013.

* cited by examiner

SEMICONDUCTOR LIGHT EMITTING DEVICE AND METHOD FOR PRODUCING THE SAME

TECHNICAL FIELD

The present invention relates to a semiconductor light emitting device and a method for producing the semiconductor light emitting device, and more particularly to a semiconductor light emitting device including a pad electrode and a method for producing the semiconductor light emitting device.

BACKGROUND ART

Some semiconductor light emitting devices including light emitting diodes (hereinafter "LEDs") and laser diodes (hereinafter "LDs") have pad electrodes and an electrically-insulating protection film on a multilayer semiconductor light emitting portion, which is composed of a plurality of semiconductor layers. Current is supplied to the semiconductor layers through the pad electrodes. The electrically-insulating protection film electrically insulates the pad electrodes from parts of semiconductor light emitting devices peripheral to the pad electrodes, and protects the semiconductor layers.

In particular, in the case where the pad electrodes are formed on the same side, when the pad electrode formation surface serves as a main light outgoing surface (face-up mount manner), the pad electrodes absorb light emitted light from the light emitting portion. For this reason, the pad electrodes may reduce the light outgoing efficiency. From this viewpoint, a variety of shapes, materials, arrangements and the like of the pad electrodes have been researched and developed.

A semiconductor light emitting device is known which includes a carrier electrode electrically connected to a transparent electrode layer for supplying carriers to semiconductor layers through the transparent electrode layer, and a wire-bonding pad electrode electrically connected to the carrier electrode, the pad electrode being arranged at a position outside the surface of the transparent electrode layer, for example, at a position on the surface of substrate or the like (e.g., Patent Document 1). In this semiconductor light emitting device, since the transparent electrode layer on the upper surface of the semiconductor layer almost entirely opened, light can outgo from the entire surface of the semiconductor light emitting device.

Also, a face-up chip type semiconductor light emitting device is known which includes a transparent positive electrode composed of a transparent electrode formed on a semiconductor layer and a bonding pad electrode formed on this transparent electrode, the bonding pad electrode including a reflective layer at least on a part of the surface of the bonding pad electrode in contact with the transparent electrode (e.g., Patent Document 2). In this semiconductor light emitting device, it is possible to suppress reduction of light emission caused by light absorption on the contact surface between the bonding pad electrode and the transparent electrode. As a result, it is possible to improve the light outgoing efficiency and thus to increase light emission intensity.

RELATED DOCUMENTS

Patent Documents

Patent Document 1: Patent Laid-Open Publication No. JP 2004-281581 A

Patent Document 2: Patent Laid-Open Publication No. JP 2006-66903 A

DISCLOSURE OF THE INVENTION

Problems to be Solved by the Invention

However, in the semiconductor light emitting device disclosed in Patent Document 1, since an additional area is required for arranging the pad electrode on the surface of the substrate in the same device size as other semiconductor light emitting devices. Semiconductor layers cannot be formed on the additional area on which the pad electrode is arranged. For this reason, the area of the semiconductor layer (light emitting layer) portion is reduced. As a result, the light output of this semiconductor light emitting device is reduced as compared with other semiconductor light emitting devices having the same device size. On the other hand, if this semiconductor light emitting device has the same semiconductor layer area as other semiconductor light emitting devices, since the additional area is required for arranging the pad electrode on the surface the substrate, the substrate necessarily has a larger area. For this reason, the number of produced semiconductor light emitting devices is reduced in the same substrate size. This semiconductor light emitting device has a disadvantage in productivity.

Also, in the semiconductor light emitting device disclosed in Patent Document 2, although the pad electrode has the reflective layer of metal with high reflectivity, even metal absorbs a part of light. Accordingly, the light emitted from the light emitting layer portion may be absorbed in repeated reflections.

From this viewpoint, in the same device size, a pad electrode with small diameter has an advantage in suppression of absorption of the light from the light emitting layer portion. However, if the pad electrode has a small diameter, a probe needle may be deviated from the pad electrode when the electrical/optical properties of the light emitting device are measured. This will cause abnormalities in the measurement. In addition, the deviated probe needle may damage the protection film, which covers the pad electrode or the semiconductor layers. This will reduce the yield of this semiconductor light emitting device in visual inspection.

The present invention is aimed at solving the problems. It is an object of the present invention to provide a semiconductor light emitting device capable of being produced with high yield and a method for producing a semiconductor light emitting device with high yield in visual inspection.

Means to Solve the Problems

The object of the present invention can be achieved by the following construction.

A semiconductor light emitting device according to the present invention includes a semiconductor layer portion, a pad electrode on the semiconductor layer portion, a protection film that covers at least said semiconductor layer, and at least one stopper member that is arranged on a peripheral part of the upper surface of said pad electrode and is spaced away from said protection film. According to this construction, when electrical/optical property inspection is conducted, the stopper member can hold a probe needle on the pad electrode. Therefore, it is possible to suppress that the protection film is damaged.

In the semiconductor light emitting device, said stopper member preferably has a semicircular arc shape. According to this construction, the probe needle can be more efficiently held on the pad electrode. In addition, although the stopper member is arranged on the pad electrode, it is possible to maintain the bonding strength between the pad electrode and an electrically-conductive wire for connecting the pad electrode to an external terminal.

In the semiconductor light emitting device, the semicircular arc shape of said stopper member opens toward the center of said pad electrode. According to this construction, even if the probe needle slides on the pad electrode, the probe needle can be guided into the bottom of the concave side surface of the semicircular arc shape. Thus, the stopper member can reliably hold the probe needle. Therefore, it is possible to avoid that the probe needle comes in contact with the protection film.

In the semiconductor light emitting device, it is preferable that a pair of pad electrodes be provided as said pad electrode, and that a pair of stopper members be provided as said stopper member on the pair of pad electrodes with the pair of stopper members being arranged on near-side parts of the pair of pad electrodes facing each other. According to this construction, when electrical/optical property inspection is conducted with a pair of probe needles being in contact with the pad electrode, the orientation and balance of the light emitting device can be stable in the inspection. In particular, said pair of stopper members are preferably arranged facing each other at positions on the pad electrodes the distance between which is the shortest.

In the semiconductor light emitting device, said stopper member can be formed of the same materials as said protection film. According to this construction, since the same material is employed as the stopper member and the protection film, it is possible to suppress increase of manufacturing cost.

Also, said stopper member can have substantially the same height as said protection film. According to this construction, the stopper member can be formed when the protection film is formed. Thus, the stopper member can be added without increasing man-hours. Therefore, it is advantageous in manufacturing cost.

Also, the semiconductor light emitting device can include a full-surface electrode between said semiconductor layer portion and the pad electrode. According to this construction, even if the diameter of the pad electrode is small, current can be uniformly diffused and flow into the semiconductor layer portion through the full-surface electrode. Therefore, it is possible to efficiently emit light.

Also, said full-surface electrode can be a transparent electrode. According to this construction, since light from the semiconductor layer portion can pass through the full-surface electrode, the light can efficiently outgo from the semiconductor light emitting device. Therefore, it is possible to improve the light emission output.

A method for producing a semiconductor light emitting device includes depositing a semiconductor layer portion on a substrate, arranging a pad electrode on a part of said semiconductor layer portion, arranging a protection film that covers said semiconductor layer portion, and arranging a stopper member on a peripheral part of the surface of said pad electrode with the stopper member protruding from the surface of said pad electrode. The method can further include conducting inspection with a probe needle being in contact with said pad electrode after arranging said stopper member. According to this construction, when electrical/optical property inspection is conducted, the stopper member can hold a probe needle on the pad electrode. Therefore, it is possible to suppress that the protection film is damaged.

Effects of the Invention

According to the present invention, it is possible to provide a semiconductor light emitting device capable of being produced with high yield in visual inspection and a method for producing a semiconductor light emitting device with high yield in visual inspection.

MODE(S) OF CARRYING OUT THE INVENTION

Embodiments according to the present invention are described with reference to the drawings. It should be appreciated, however, that the embodiments described below are illustrations of a semiconductor light emitting device and a method for producing the semiconductor light emitting device to give a concrete form to technical ideas of the invention, and a semiconductor light emitting device and a method for producing the semiconductor light emitting device of the invention are not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference numerals and their description is omitted. In addition, a plurality of structural elements of the present invention may be configured as a single part that serves the purpose of a plurality of elements, on the other hand, a single structural element may be configured as a plurality of parts that serve the purpose of a single element.

Figure 9:
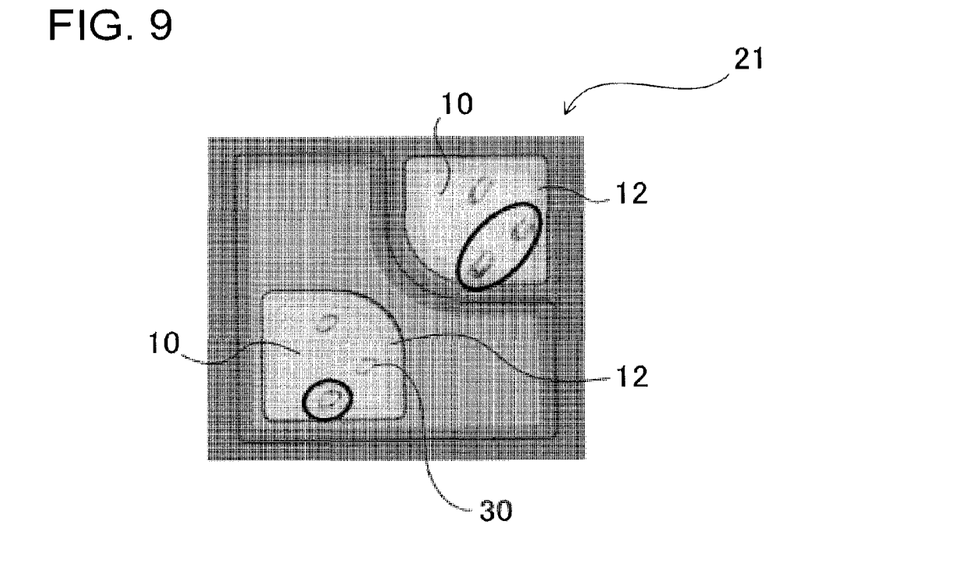
FIG. 9 is a microscope image showing damage of a protection film of a semiconductor light emitting device as viewed from the top side after the electrical/optical properties are measured by using probe needles.

Protection film damage is now described which is caused by probe needles in electrical/optical property inspection. FIG. 9 is a microscope image showing damage of a protection film of a semiconductor light emitting device as viewed from the top side after the electrical/optical properties are measured by using probe needles. In this Figure, heavy line circles indicate measurement point deviation of the probe needles, and probe needle scratch marks as the protection film damage resulting from the measurement point deviation. As shown in this Figure, it can be found that the probe needles slide on pad electrodes and hit a protection film on the peripheral parts of the pad electrode upper surfaces, which in turn damages the protection film.

Figure 10:
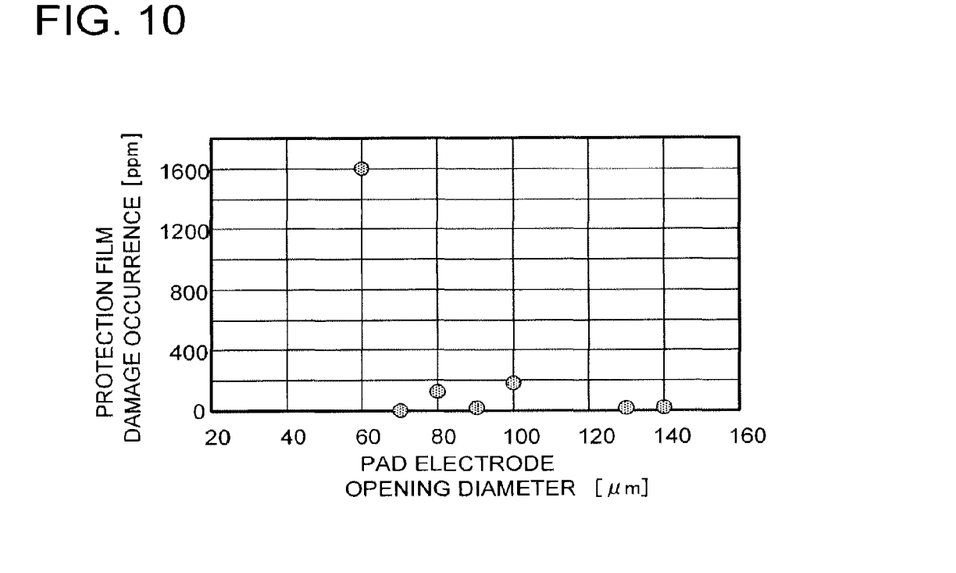
FIG. 10 is a graph showing relationship between the diameter of an opening of a pad electrode and the incidence of protection film damage.

FIG. 10 is a graph showing relationship between the diameter of an opening of the pad electrode and the incidence of protection film damage. Here, the diameter of an opening of the pad electrode refers to the diameter of an opening area of the pad electrode upper surface that is exposed upward. As shown in FIG. 10, it can be found that, in the case where the diameter of an opening of the pad electrode is to not greater than 60 μm, the incidence of protection film damage caused by the probe needle sharply increases in electrical/optical property inspection.

<First Embodiment>

Figure 1:
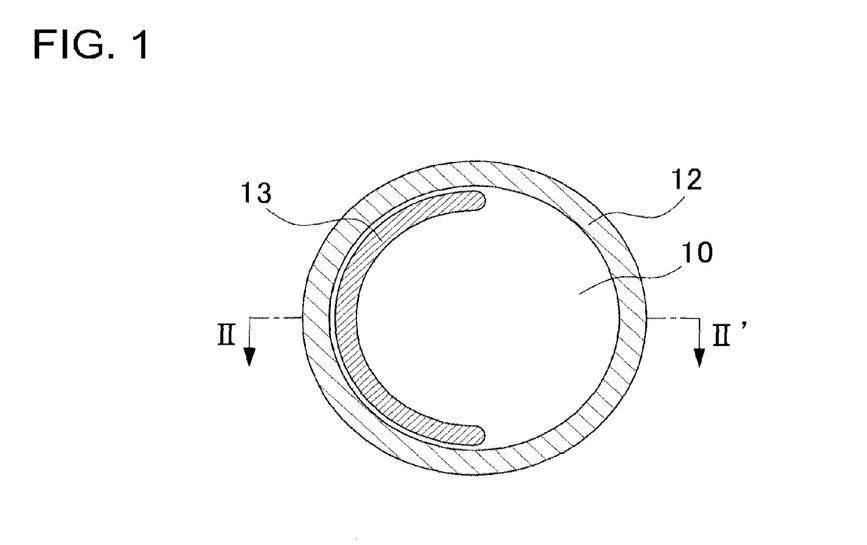
FIG. 1 is a schematic plan view showing a pad electrode and a stopper member of a semiconductor light emitting device according to a first embodiment.
Figure 2:
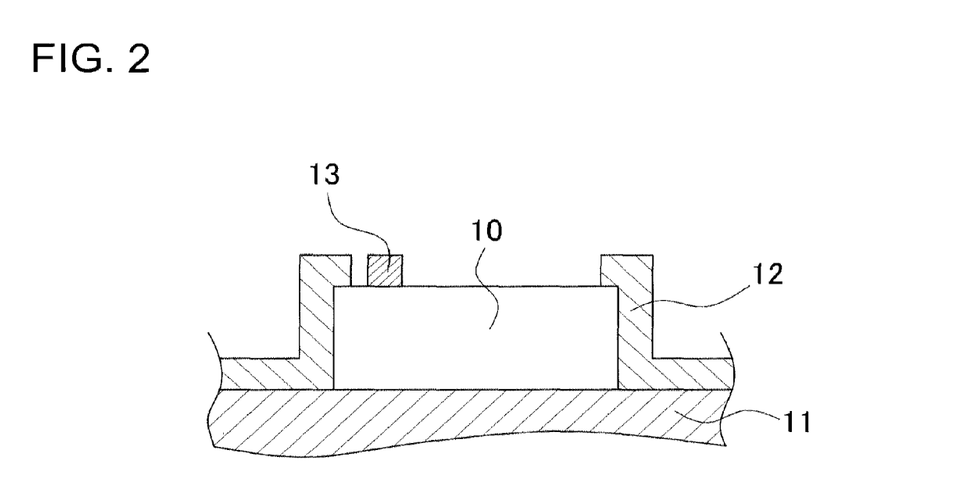
FIG. 2 is a schematic cross-sectional view of the pad electrode and the stopper member shown in FIG. 1 taken along the line II-II'.

With reference to FIGS. 1 to 2, a semiconductor light emitting device according to a first embodiment is now described. FIG. 1 is a schematic plan view showing a pad electrode and a stopper member of the semiconductor light emitting device according to the first embodiment. FIG. 2 is a cross-sectional view showing a pad electrode and a stopper member of the semiconductor light emitting device according to the first embodiment taken along the line II-II' in FIG. 1.

The semiconductor light emitting device according to the first embodiment at least includes a pad electrode 10, a semiconductor layer portion 11, a protection film 12, and a stopper member 13. In this semiconductor light emitting device, the pad electrode 10 and the electrically-insulating protection film 12 are arranged on the multilayer semiconductor layer portion 11, which is composed of a plurality of semiconductor layers including a light emission layer. Current is supplied to the semiconductor layer portion 11 through the pad electrode 10. The protection film 12 electrically insulates the pad electrode 10 from parts of the semiconductor light emitting device peripheral to the pad electrode, and protects the semiconductor layer portion 11. The protection film 12 covers the side surface and an upper surface peripheral part of the pad electrode 10, and the upper surface of the semiconductor layer portion 11. Most upper surface part of the pad electrode 10 is exposed from the protection film 12.

The pad electrode 10 has a substantially circular shape as viewed from the top side. The peripheral part of the pad electrode 10 is covered by the protection film 12. A stopper member 13 is arranged on peripheral parts of the upper surface of the pad electrode 10 and is spaced away from the protection film 12.

The stopper member 13 is arranged in an edge part of the pad electrode as shown in FIG. 1, etc. The stopper member preferably has a shape extending along the edge of pad electrode. In this construction, it is possible to surely provide the pad electrode with an area onto which a wire can be connected by wire bonding. It is preferable that the stopper member 13 have a semicircular arc shape extending along the shape of the protection film 12, which covers the upper surface peripheral part of the pad electrode 10, and be arranged on the outer side of the pad electrode 10 as viewed from the top side. In this construction, the upper surface of the pad electrode 10 can have a sufficient exposed area in addition to the area where the stopper member 13 covers the upper surface of the pad electrode 10.

As for the orientation of the stopper member 13, the recessed concave side surface of the semicircular arc shape of the stopper member 13 faces an area on which the probe needle will be placed, in other words, the semicircular arc shape of the stopper member 13 opens toward the probe needle. According to this orientation, even if the probe needle slides on the pad electrode and comes in contact with the stopper member 13, the probe needle can be guided into the bottom of the concave side surface of the semicircular arc shape and can be easily held in the semicircular arc shape. For this reason, as compared with the case where the stopper member has a straight shape, the stopper member according to this embodiment can surely serve to hold the probe needle. As a result, it is possible to avoid that the probe needle slides along the stopper member and then hits the protection film.

However, the shape of the stopper member 13 is not limited to this semicircular arc shape. The stopper member 13 can have suitable shapes that can hold the probe needle on the pad electrode 10 and can surely provide an area for receiving an electrically-conductive wire for connecting the pad electrode 10 to an external terminal. Examples of the suitable shapes can be provided by arc shape, L shape, and the like. The upper surface of the pad electrode 10 can be either a rough surface with convex and concave parts, or flat surface.

According to this embodiment, since the stopper member 13 is arranged at the position toward which the probe needle slides when the electrical/optical properties of the semiconductor light emitting device are measured, the stopper member 13 can suppress the slide amount of the probe needle on the pad electrode 10, and can hold the probe needle on the pad electrode 10. Also, in the case where the stopper member 13 has a semicircular arc shape, the area of a part of the pad electrode 10 can be large in which the probe needle will be held. Therefore, even if the probe needle slides on the pad electrode 10, the stopper member 13 can efficiently hold the probe needle. In addition, it is possible to surely provide the upper surface of the pad electrode 10 with an area for receiving an electrically-conductive wire for connecting the pad electrode 10 to an external terminal. Therefore, it is possible to maintain the bonding strength between the pad electrode 10 and the conductive wire.

Also, since the stopper member is thus arranged on the pad electrode, even in the case where the diameter of the pad electrode is small, it is possible to suppress protection film damage caused by the probe needle, or improper measurement that will occur when the probe needle slides on the pad electrode and moves out of the pad electrode. For this reason, it is possible to reduce the diameter of the pad electrode. As a result, it is possible to reduce the absorption amount of light from the light emitting layer, which travels right under the pad electrode and is absorbed by the pad electrode. Therefore, it is possible to improve the light emission efficiency without increasing the size of the light emitting layer (i.e., the size of the semiconductor light emitting device).

<Second Embodiment>

Figure 3:
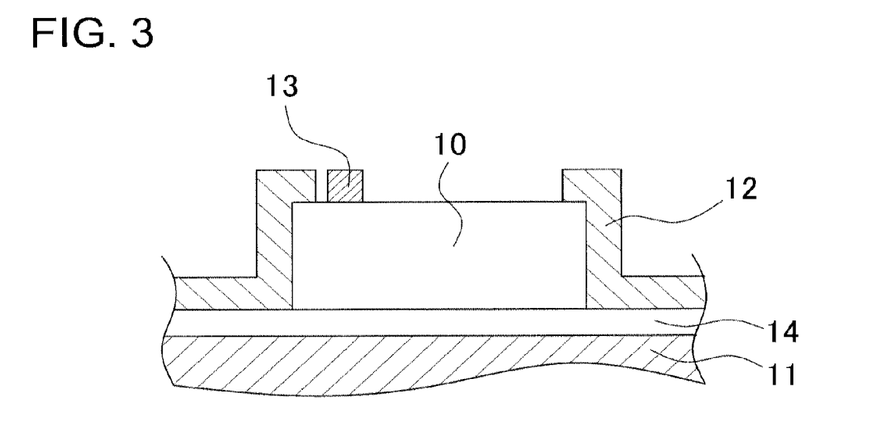
FIG. 3 is a schematic cross-sectional view showing a pad electrode and a stopper member of a semiconductor light emitting device according to a second embodiment.

A semiconductor light emitting device according to a second embodiment is now described with reference to FIG. 3. FIG. 3 is a schematic cross-sectional view showing a pad electrode and a stopper member of a semiconductor light emitting device according to a second embodiment. The semiconductor light emitting device according to the second embodiment is substantially similar to the first embodiment except that a full-surface electrode 14 is arranged between the semiconductor layer portion 11 and the pad electrode 10.

The semiconductor light emitting device according to the second embodiment includes the full-surface electrode 14 on the semiconductor layer portion 11. The pad electrode 10 is arranged on the full-surface electrode 14. The protection film 12 covers the side surface and an upper surface peripheral part of the pad electrode 10, and the full-surface electrode 14. The stopper member 13 is arranged on a peripheral part of the upper surface of the substantially circular pad electrode 10 and is spaced away from the protection film 12. The stopper member 13 has a semicircular arc shape extending along the shape of the protection film 12, which covers the upper surface peripheral part of the pad electrode 10. The upper surface of the pad electrode 10 has a sufficient exposed area in addition to the area where the stopper member 13 covers the upper surface of the pad electrode 10.

In particular, in the case where the semiconductor layer portion 11 includes different conductive type semiconductor layers each of which the pad electrode is arranged on, current may not uniformly flow through the entire surface of one of the semiconductor layers that is of high electrical resistance. For this reason, the full-surface electrode 14 is arranged between the pad electrode 10 and the semiconductor layer portion 11. As a result, even if the diameter of the pad electrode 10 is small, the current can be uniformly diffused over the entire surface of the semiconductor layer portion 11 through the full-surface electrode 14. In the case where the full-surface electrode 14 serves as transparent electrode, the light from the light emission layer of the semiconductor layers 11 passes through the full-surface electrode 14, and outgoes from the semiconductor light emitting device.

<Third Embodiment>

Figure 4:
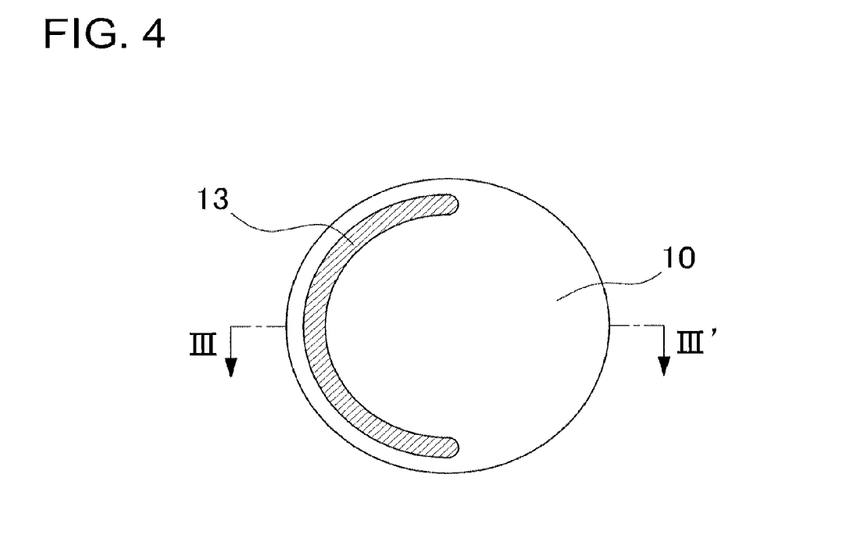
FIG. 4 is a schematic plan view showing a pad electrode and a stopper member of a semiconductor light emitting device according to a third embodiment.
Figure 5:
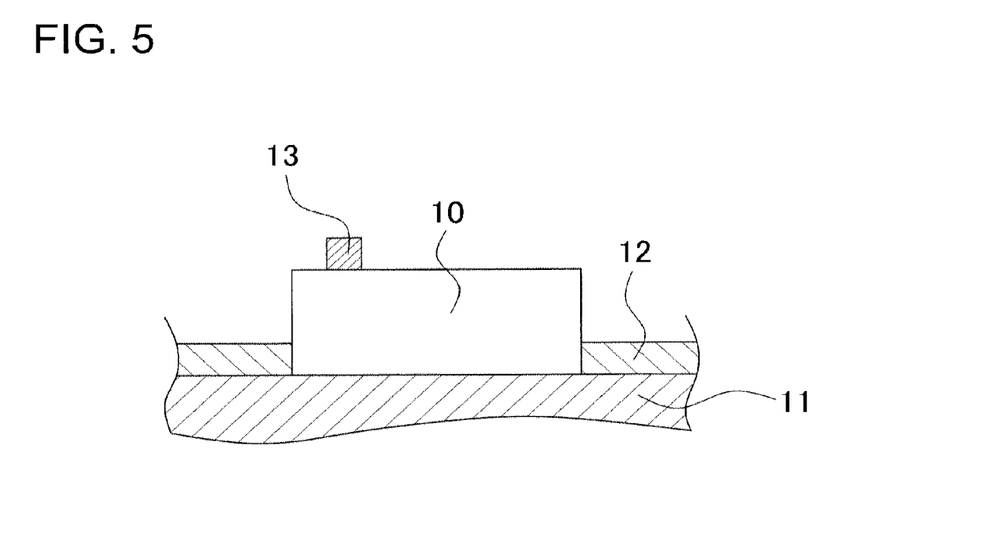
FIG. 5 is a schematic cross-sectional view of the pad electrode and the stopper member shown in FIG. 4 taken along the line III-III'.
Figure 6:
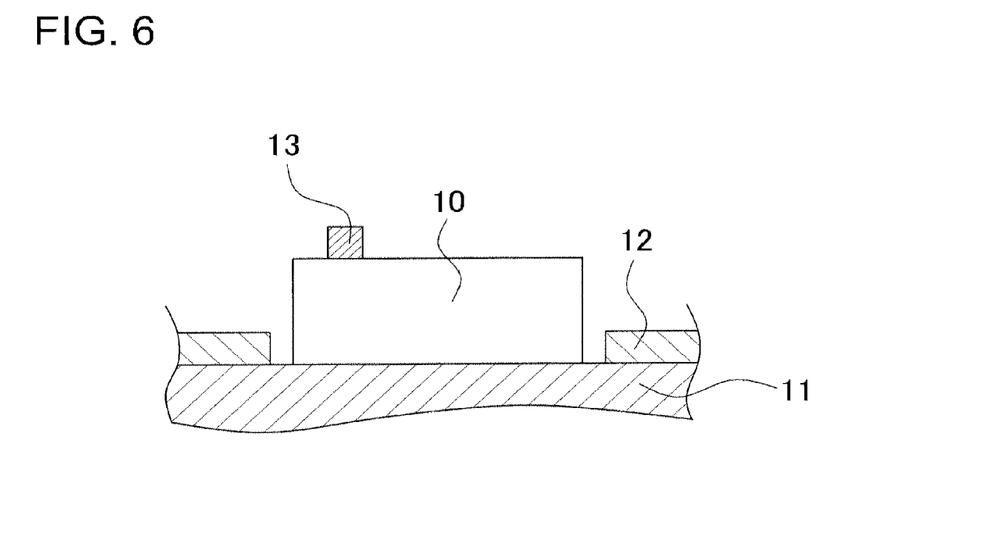
FIG. 6 is a schematic cross-sectional view of a pad electrode and a stopper member according to a modified embodiment shown in FIG. 4 taken along the line III-III'.

A semiconductor light emitting device according to a third embodiment is now described with reference to FIGS. 4 to 6. FIG. 4 is a schematic plan view showing a pad electrode and a stopper member of the semiconductor light emitting device according to the third embodiment. FIG. 5 is a schematic cross-sectional view of the pad electrode and the stopper member shown in FIG. 4 taken along the line III-III'. FIG. 6 is a schematic cross-sectional view of a pad electrode and a stopper member according to a modified embodiment shown in FIG. 4 taken along the line III-III'. The semiconductor light emitting device according to the third embodiment is substantially similar to the first embodiment except that the protection film 12 covers a part of the pad electrode 10 different from the first embodiment.

The semiconductor light emitting device according to the third embodiment includes the pad electrode 10 on the semiconductor layer portion 11. The stopper member 13 is arranged on the pad electrode 10. The protection film 12 according to this embodiment is required to cover at least the semiconductor layer portion 11. The upper surface of the pad electrode 10 may be exposed except a part of the upper surface of the pad electrode 10 on which the stopper member 13 is arranged. The protection film 12 can be in contact with the side surface of the pad electrode 10 so that the protection film 12 partially covers the side surface of the pad electrode 10 at the same height as the thickness of the side surface of the pad electrode 10, which covers the semiconductor layer portion 11 as shown in the cross-sectional view of FIG. 5. Alternatively, the protection film 12 can be spaced away from the side surface of the pad electrode 10 as shown in the cross-sectional view of FIG. 6. Also, the protection film 12 may entirely cover the side surface of the pad electrode similarly to the foregoing first and second embodiments. In addition, the semiconductor light emitting device according to the third embodiment can have the full-surface electrode 14 between the semiconductor layer portion 11 and the pad electrode 10 similar to the second embodiment.

<Fourth Embodiment>

Figure 7:
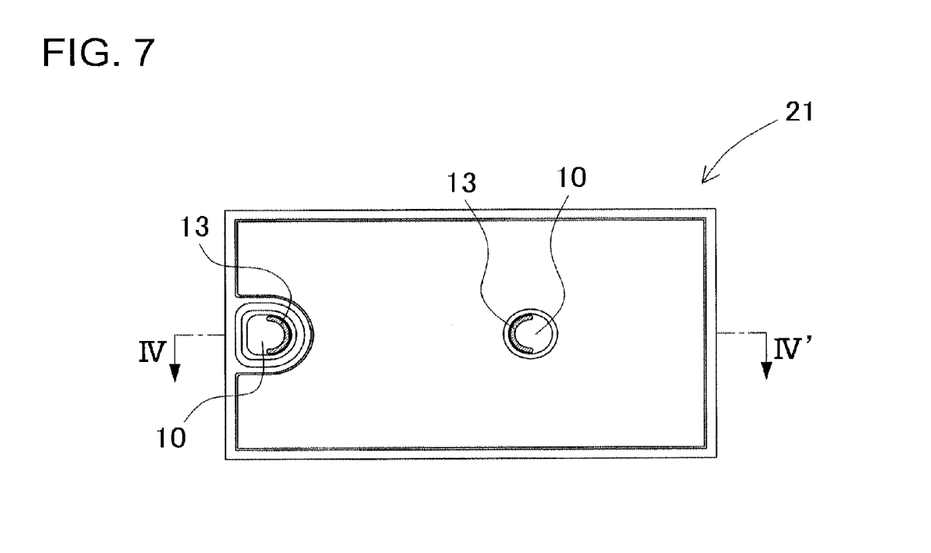
FIG. 7 is a schematic plan view showing a semiconductor light emitting device according to a fourth embodiment.
Figure 8:
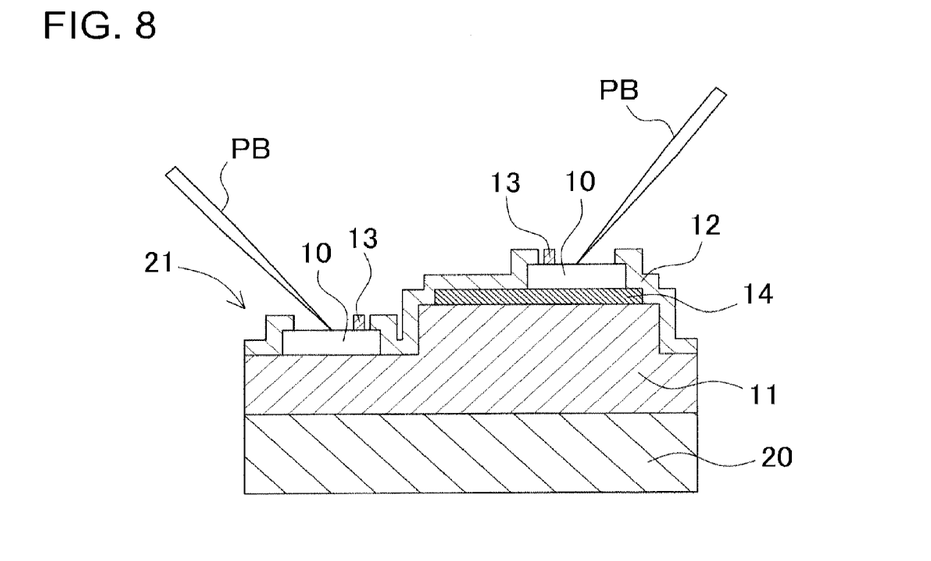
FIG. 8 is a schematic cross-sectional view of the semiconductor light emitting device shown in FIG. 7 taken along the line IV-IV'.

A semiconductor light emitting device according to a fourth embodiment is now described with reference to FIGS. 7 to 8. FIG. 7 is a schematic plan view showing a semiconductor light emitting device according to the fourth embodiment. FIG. 8 is a schematic cross-sectional view of the semiconductor light emitting device shown in FIG. 7 taken along the line IV-IV'.

In the semiconductor light emitting device according to the fourth embodiment, the semiconductor layer portion 11 is arranged on a substrate 20. Two pad electrodes 10 are arranged on the semiconductor layer portion 11 to supply current to the semiconductor layer portion 11. In addition, the semiconductor light emitting device may have the full-surface electrode 14, which can provide ohmic contact between the pad electrode 10 and the semiconductor layer portion 11. The semiconductor light emitting device further includes the protection film 12, which electrically insulates the pad electrodes 10 from parts of the semiconductor light emitting device peripheral to the pad electrodes, and protects the semiconductor layer portion 11 or the full-surface electrode 14. The protection film 12 covers the side surfaces and upper surface peripheral parts of the pad electrodes 10, the full-surface electrode 14, and parts of the side surfaces and the upper surface the semiconductor layer portion 11. The upper surface of the pad electrode 10 is partially exposed.

The pad electrodes 10 have a substantially circular shape as viewed from the top side. The peripheral parts of the pad electrodes 10 are covered by the protection film 12. The stopper member 13 is arranged on a peripheral part of the upper surface of each pad electrode 10 and is spaced away from the protection film 12. As discussed above, the stopper member can be arranged not only on the p-side electrode but also on the n-side electrode. The stopper member may be arranged only on the n-side electrode.

It is preferable that the stopper member 13 have a semicircular arc shape extending along the shape of the protection film 12, which covers the upper surface peripheral part of the pad electrode 10, and be arranged on the outer side of the pad electrode 10 as viewed from the top side. The pair of stopper members are arranged facing each other at positions on the pad electrodes the distance between which is the shortest. According to this embodiment, since the stopper members 13 are arranged at the positions toward which the probe needles PB slide, even if probe needles PB slide, the stopper members 13 can effectively hold the probe needles PB. In electrical/optical property inspection, even if load is applied to the pair of probe needles PB when the probe needles PB come in contact the pad electrode 10, the orientation and balance of the light emitting device can be stable.

The following description will describe the construction of the semiconductor light emitting device according to this embodiment.

(Semiconductor Light Emitting Element)

LEDs, LDs and the like can be used as a semiconductor light emitting element. Any types of semiconductor light emitting elements can be used. Examples of such semiconductor light emitting elements can be provided by various types of semiconductors such as ZnSe, and GaN. A suitable example can be provided by a nitride semiconductor ($In_XAl_YGa_{(1-X-Y)}N$, $0 \leq X \leq 1$, $0 \leq Y \leq 1$, $X+Y \leq 1$) that can emit light with a short wavelength capable of efficiently exciting phosphors. In addition, the light emission wavelength can be selected by the variation of materials and mixed crystal ratios of the semiconductor layer.

(Protection Film)

The electrically-insulating protection film of $SiO_2$ or the like can be formed on the semiconductor light emitting element. The protection film is only required to cover at least the semiconductor layer portion and the full-surface electrode. The protection film has openings on the pad electrodes having a certain shape as viewed from the top side. The surfaces of the pad electrodes are exposed in the openings. An electrically-conductive member is formed on the pad electrode surface exposed in the opening of the protection film, and is connected for electrical connection to an electrically-conductive wire or the like. The shape of the opening of the protection film is not specifically limited. The shape and the size of the opening of the protection film are only required to provide an area on which the electrically-conductive member can be formed on the pad electrode surface. Thus, the upper surface of the element can be properly protected. In the case where one opening is formed on each of the pad electrodes, the short circuit caused by positioning deviation of the electrically-conductive member or the like can be prevented between the pad electrodes. Therefore, it is possible to provide a device that is less likely to short-circuit.

(Pad Electrode)

Figure 11:
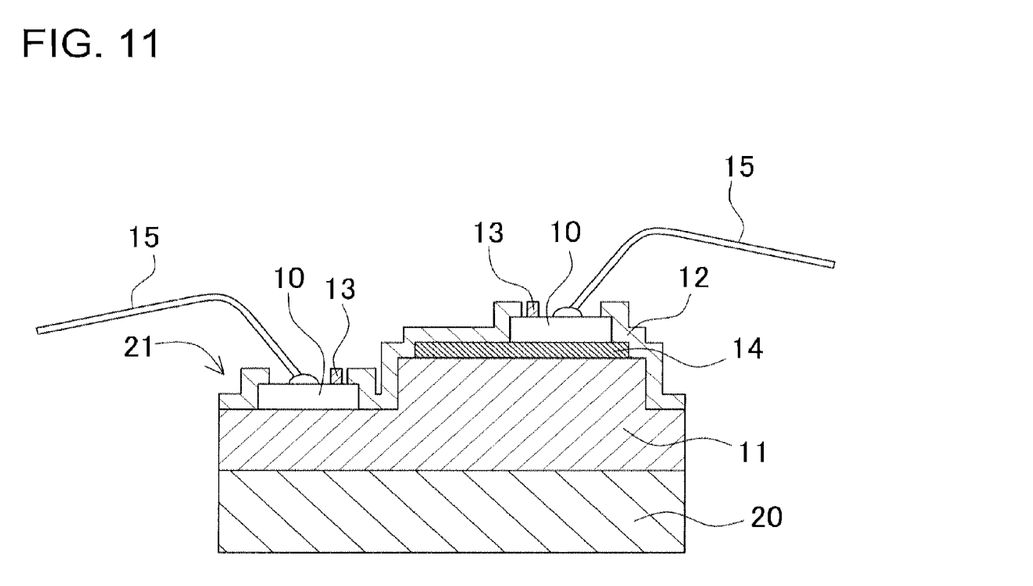
FIG. 11 is a schematic cross-sectional view showing the semiconductor light emitting device after electrically-conductive wires are connected to the semiconductor light emitting device by wire bonding.

The pad electrode can have a circular shape, or a rounded rectangular. In addition, the pad electrode can have various shapes such as polygonal shape (e.g., triangle, quadrangle, etc.). The size of the pad electrode is preferably not greater than 60 μm but allows wire bonding, or installation using bump, eutectic bonding and the like. FIG. 11 is a cross-sectional view showing the semiconductor light emitting device after electrically-conductive wires 15 are connected to the semiconductor light emitting device by wire bonding. The stopper member is arranged on the pad electrode away from the center of the pad electrode as shown in this Figure. Accordingly, it is possible to surely provide an area on which the electrically-conductive wire 15 is connected to the pad electrode by bonding.

The pad electrode is preferably formed of a metal material suitable for joining such as wire-bonding, bumping, or eutectic bonding. The pad electrode can be formed of a single metal material. Alternatively, the pad electrode can be constructed of two or more laminated layers.

In the case where the pad electrode is in direct contact with the semiconductor layer portion, a material capable of providing ohmic connection to the semiconductor layer portion is necessarily selected as the bottom layer of the pad electrode. Alternatively, the full-surface electrode is formed between the semiconductor layer portion and the pad electrode so that ohmic contact is provided between the pad electrode and the pad electrode.

(Full-Surface Electrode)

The full-surface electrode can be formed of a thin metal film or electrically-conductive oxide. A suitable example of the thin metal film can be provided by a thin film of Ni/Au or the like with 50 to 300 angstroms. Also, a suitable example of the electrically-conductive oxide film can be provided by an oxide film including at least one element selected from the group consisting of zinc (Zn), indium (In), tin (Sn), and magnesium (Mg). Specific examples of the electrically-conductive oxide can be provided by ZnO, AZO (ZnO doped with Al), IZO (ZnO doped with In), GZO (ZnO doped with Ga), $In_2O_3$, ITO ($In_2O_3$ doped with Sn), IFO ($In_2O_3$ doped with F), $SnO_2$, ATO ($SnO_2$ doped with Sb), FTO ($SnO_2$ doped with F), CTO ($SnO_2$ doped with Cd), MgO, and the like. Films of these materials can be formed by physical film forming methods (vapor deposition, sputtering, pulse laser deposition (PLD), etc.) or chemical film forming methods (sol-gel method, spraying, etc.). The full-surface electrode may have a grid shape with rectangular openings or shape with stripe-shaped openings.

The full-surface electrode can be used as a wiring member for connecting the semiconductor layer portion to the ohmic contact pad electrode.

(Stopper Member)

The stopper member suppresses the sliding amount of the probe needle on the pad electrode in electrical/optical property inspection of semiconductor light emitting device, and holds the probe needle on the pad electrode. As a result, it is possible to reduce the possibility of protection film damage caused by probe needle sliding on the pad electrode, and to avoid improper measurement.

The stopper member has a certain height that allows the stopper member to serve as the stopper. The height of the stopper member is preferably the same as or grater than the protection film.

The stopper member is formed of an electrically-insulating material, preferably $SiO_2$. However, the stopper member may be formed of the same material as the pad electrode or other metals. The material of the stopper member is not specifically limited. In the case where the stopper member is formed of the same material as the protection film and has the same height as the protection film, this stopper member can be formed only by etching the protection film in a manufacturing process. Accordingly, there is an advantage that an additional process is not required. In the case where the stopper member is formed of metal, the stopper member can have high strength and be eclectically conductive. Accordingly, even if the probe needle slides, the stopper member firmly holds the probe needle. In addition, even if the probe needle rides on or is caught on the stopper member, the electrical/optical properties of the semiconductor light emitting device can be measured.

(Substrate)

The substrate is formed of a material suitable for epitaxial growth of semiconductor layers. The size, thickness, and the like of the substrate are not specifically limited. Examples of the substrate suitable for epitaxial growth of nitride semiconductor can be provided by electrically-insulating substrates such as sapphire and spinel, and electrically-conductive substrates such as SiC, nitride semiconductor (e.g., GaN etc.).

(Production Method of Semiconductor Light Emitting Device)

The following description will describe a method for producing a semiconductor light emitting device according to the present invention. The method is similar to conventional methods for producing a semiconductor light emitting device except the later-discussed processes.

First, the semiconductor layer portion 11, which includes different conductive type semiconductor layers, is deposited on the substrate 20. Subsequently, a mask is formed on the semiconductor layer portion 11 by using a photoresist, $SiO_2$ or the like. One of the different conductive type semiconductor layers is exposed by reactive ion etching (RIE). After the mask is removed, the full-surface electrode 14 is formed on the other type semiconductor layer. The pad electrodes 10 are formed on the exposed semiconductor layer and the full-surface electrode 14. The protection film 12 is formed covering the element upper surface. Subsequently, a pattern for forming the opening and the stopper member 13 is formed on the upper surface of the pad electrode 10. Thus, the opening and the stopper member 13 are simultaneously formed on the pad electrode 10 by etching. Finally, the substrate 20 (wafer) is divided into a plurality of devices. As a result, the semiconductor light emitting device can be produced.

In the case where the stopper member 13 is formed of metal, the semiconductor light emitting device including the stopper member 13 of metal can be produced similar to the aforementioned production method except that the stopper member 13 is formed after the opening of the pad electrode 10 is formed by etching with the element upper surface being covered by the protection film 12.

EXAMPLE 1

The following description will describe a semiconductor light emitting device according to an example 1 with reference to FIGS. 7 and 8. FIG. 7 is a schematic plan view showing a semiconductor light emitting device according to the fourth embodiment. FIG. 8 is a cross-sectional view showing the semiconductor light emitting device according to the fourth embodiment taken along the line IV-IV' in FIG. 7.

A semiconductor light emitting device 21 according to the example 1 includes the substrate 20, the semiconductor layer portion 11 deposited on the substrate 20, the pad electrodes 10 for supplying current to the semiconductor layer portion 11, the full-surface electrode 14 for connecting the semiconductor layer portion 11 to the ohmic contact pad electrodes 10, the protection film 12 for electrically-insulating the pad electrodes 10 from parts of the semiconductor light emitting device peripheral to the pad electrodes and for protecting the semiconductor layer portion 11 and the full-surface electrode 14, and the stopper members 13 spaced away from the protection film 12 on the pad electrode 10.

In the semiconductor light emitting device 21, the semiconductor layer portion 11 is arranged on the sapphire substrate 20. In the semiconductor layer portion 11, after a buffer layer (primary layer) of GaN is formed on the substrate, a multilayer structure including an active layer of GaN group compound semiconductor is deposited on the buffer layer. Specifically, the semiconductor layer portion 11 is constructed of the multilayer structure composed of a plurality of semiconductor layers including an n-type semiconductor layer, the active layer, and a p-type semiconductor layer, which are deposited in this order.

Parts of the active layer and p-type semiconductor layer are arranged on the n-type semiconductor layer are removed. In addition, a part of the n-type semiconductor layer in the thickness direction under the removed parts of the active layer and p-type semiconductor layer is removed so that the surface of the n-type semiconductor layer is partially exposed. The n-side pad electrode is formed on the exposed surface of the n-type semiconductor layer.

The full-surface electrode 14 as an electrically-conductive oxide film formed of ITO is formed substantially entire the surface of the p-type semiconductor layer. The p-side pad electrode is formed on a part of the surface of the full-surface electrode 14.

The n-side and p-side pad electrodes are formed of the same materials. Rh, W, and Au are laminated as the n-side and p-side pad electrodes in this order.

The upper surface of the semiconductor light emitting device 21 is covered by the protection film 12 formed of $SiO_2$. The opening of the protection film 12 is arranged on the upper surface of each pad electrode. Thus, the upper surface of each pad electrode is partially exposed. The stopper member 13 with semicircular arc shape is spaced away from the protection film 12 on the exposed part of the upper surface of each pad electrode. The stopper member 13 is formed of $SiO_2$, which is the same material as the protection film 12. The stopper member 13 has the same height as the protection film 12.

The semiconductor light emitting device according to the example 1 is produced by the following production method.
(Formation of Semiconductor Layer Portion 11)

The MOVPE reaction apparatus is used to deposit the buffer layer of GaN on the sapphire substrate 20. Subsequently, the MOVPE reaction apparatus deposits an n-type contact layer and an n-type cladding layer as the n-type semiconductor layer, the active layer, and a p-type cladding layer and a p-type contact layer as the p-type semiconductor layer in this order on the buffer layer. Thus, a wafer is produced. The thus-produced wafer is annealed at 600° C. in an atmosphere of nitrogen in a reaction container so that the electrical resistance of the p-type cladding layer and the p-type contact layer are further reduced.
(Formation of N-Type Semiconductor Layer Exposed Part)

After annealed, the wafer is removed from the reaction container. Subsequently, the mask with a predetermined shape is formed on the surface of the p-type contact layer as the top layer. After that, the wafer with the mask formed thereon is etched by an etching apparatus so that a part of the n-type contact layer is exposed.
(Formation of Full-Surface Electrode 14)

After removing the mask, the wafer is placed in a sputtering apparatus. Also, an oxide target composed of sintered compact of $In_2O_3$ and $SnO_2$ is placed in the sputtering apparatus. An ITO film is formed as the electrically-conductive oxide film on substantially the entire surface of the p-type contact layer of the wafer by the sputtering apparatus, and will serve as the full-surface electrode 14.
(Formation of P-Side and N-Side Pad Electrodes)

The substantially circular p-side pad electrode formed of metal is formed on a part of the full-surface electrode 14 by vapor deposition and photolithography. Also, the substantially circular n-side pad electrode formed of the same material as the p-side pad electrode is formed on the surface of the n-type contact layer formed of an n-type semiconductor layer. In the case where the p-side and n-side pad electrodes are formed of the same material, the number of production process can be small. However, the p-side and n-side pad electrodes may be formed of different materials from each other.
(Formation of Stopper Member 13)

$SiO_2$ is formed into a film shape as the protection film 12 on the upper surface of the semiconductor light emitting device 21. Subsequently, a mask is formed which has a predetermined pattern for forming the pad electrode openings and the stopper members 13. In this pattern, each of the pair of stopper members 13 is spaced away from the protection film 12, and has a semicircular arc shape extending the shape of the pad electrode opening of the protection film 12. The pair of stopper members 13 are arranged facing each other at positions on the pad electrodes the distance between which is the shortest. After the etching process, when the resist mask is removed, the stopper members 13 are formed in the openings of the protection film 12 on the pad electrode upper surfaces simultaneously with the protection film 12. The stopper members 13 are formed of the same material $SiO_2$ as the protection film 12, and have the same height as the protection film 12.

The thus produced wafer is cut along predetermined lines and is divided into the semiconductor light emitting devices 21. Since the stopper member 13 can suppress protection film damage in the semiconductor light emitting device 21, it is possible to provide a semiconductor light emitting device capable of being produced with high yield in visual inspection.

EXAMPLE 2

The following description will describe a semiconductor light emitting device according to an example 2. The semiconductor light emitting device according to the example 2 is constructed similar to the example 1 except that the n-side and p-side pad electrodes are composed of the same materials of Cr, Pt, Ru, and Au, which are formed in multilayer construction in this order in the semiconductor light emitting device according to the example 1.

EXAMPLE 3

The following description will describe a semiconductor light emitting device according to an example 3. The semiconductor light emitting device according to the example 3 is constructed similar to the example 1 except that the stopper members 13 are formed of metal in the semiconductor light emitting device according to the example 1 and constructed as follows.

(Formation of Stopper Member 13)

An $SiO_2$ film is formed on the upper surface of the semiconductor light emitting device 21. A mask with a predetermined pattern corresponding to the pad electrode openings is formed. Subsequently, the $SiO_2$ film is etched so that the protection film 12 is formed which has the openings on the pad electrode upper surfaces. After the etching process, the resist is removed. A metal film is formed in the pad electrode exposed portion. The metal film contains at least one of the same metals as the pad electrode. Subsequently, a mask with a predetermined pattern corresponding to the stopper member 13 is formed in the opening of each pad electrode for etching or lifting of process. In this pattern, each of the pair of stopper members 13 is spaced away from the protection film 12, and has a semicircular arc shape extending along the shape of the pad electrode opening of the protection film 12. The pair of stopper members 13 are arranged facing each other at positions on the pad electrodes the distance between which is the shortest. After the etching process, the resist is removed. Thus, the stopper member 13 formed of metal is formed on the pad electrode upper surface exposed portion.

The protection film damage occurrence and the light output of the thus-constructed semiconductor light emitting devices according to the examples 1 and 2 are compared with a reference example. The diameter of the opening of the pad electrode 10 according to each of the examples 1 and 2 is 43 μm. The stopper member 13 is arranged on the upper surface of the pad electrode 10. A semiconductor light emitting device according to the reference example is constructed similar to the example 1 except that the diameter of the opening of the pad electrode 10 is 60 μm, and the stopper member 13 is not formed on the upper surface of the pad electrode 10 in the semiconductor light emitting device according to the example 1. The light outputs of the examples 1 and 2 and the reference example are calculated. Thus, the light outputs of the examples 1 and 2 are compared with the reference example in ratio. Table 1 shows the results.

TABLE 1

|  | Ref. Ex | Ex. 1 | Ex. 2 |
|---|---|---|---|
| Semiconductor LED Size (μm) |  | 500 × 290 |  |
| Pad Electrode Opening Diameter (μm) | 60 | 43 | 43 |
| Light Output (%) | — | +1 to 1.5 | +0.5 to 1 |

Since the stopper member 13 is arranged in the examples 1 and 2, protection film damage is not found. Also, since the diameter of the opening of the pad electrode 10 in the examples 1 and 2 is smaller, it is found that the light output in the examples 1 and 2 is improved as compared with the reference example. In addition, since the material of the pad electrode 10 can be suitably selected in accordance with requirement, it can be expected that the pad electrode 10 is more tightly joined to the full-surface electrode 14 or the semiconductor layer portion 11 and that the joining reliability of the pad electrode 10 is improved.

As discussed above, the stopper member formed on the pad electrode suppresses the protection film damage caused by the probe needle. Therefore, it is possible to provide a semiconductor light emitting device capable of being produced with high yield in visual inspection. In addition, since the stopper member facilitates reduction of the diameter of the pad electrode, it is found that the light outgoing efficiency is improved.

INDUSTRIAL APPLICABILITY

The present invention can be suitably applied to any semiconductor light emitting devices such as LED and LD.

| EXPLANATION OF REFERENCE LETTERS OR NUMERALS | |
|---|---|
| 10 | Pad Electrode |
| 11 | Semiconductor Layer Portion |
| 12 | Protection Film |
| 13 | Stopper Member |
| 14 | Full-Surface Electrode |
| 15 | Electrically-Conductive Wire |
| 20 | Substrate |
| 21 | Semiconductor Light Emitting Device |
| 30 | Probe Needle Scratch Mark |
| PB | Probe Needle |

The invention claimed is:

1. A semiconductor light emitting device comprising:
a semiconductor layer portion;
a pad electrode on the semiconductor layer portion;
a protection film that covers at least said semiconductor layer portion, and
at least one stopper member that is arranged on a peripheral part of an upper surface of said pad electrode and is spaced away from said protection film,
wherein said at least one stopper member has a semicircular arc shape.

2. The semiconductor light emitting device according to claim 1, wherein the semicircular arc shape of said stopper member opens toward the center of said pad electrode.

3. The semiconductor light emitting device according to claim 1, wherein said at least one stopper member is formed of $SiO_2$.

4. The semiconductor light emitting device according to claim 1, wherein said at least one stopper member is formed of a metal.

5. The semiconductor light emitting device according to claim 1, wherein a pair of pad electrodes are provided as said pad electrode, wherein a pair of stopper members are provided as said stopper member on the pair of pad electrodes with the pair of stopper members being arranged on near-side parts of the pair of pad electrodes facing each other.

6. The semiconductor light emitting device according to claim 5, wherein said pair of stopper members are arranged facing each other at positions on the pad electrodes the distance between which is the shortest.

7. The semiconductor light emitting device according to claim 1, wherein said stopper member is formed of the same materials as said protection film.

8. The semiconductor light emitting device according to claim 7, wherein said stopper member has substantially the same height as said protection film.

9. The semiconductor light emitting device according to claim 1 further comprising a full-surface electrode between said semiconductor layer portion and the pad electrode.

10. The semiconductor light emitting device according to claim 9, wherein said full-surface electrode is a transparent electrode.

11. A method for producing a semiconductor light emitting device, the method comprising:
    depositing a semiconductor layer portion on a substrate;
    arranging a pad electrode on a part of said semiconductor layer portion;
    arranging a protection film that covers said semiconductor layer portion; and
    arranging a stopper member on a peripheral part of an upper surface of said pad electrode with the stopper member protruding from the surface of said pad electrode,
    wherein said stopper member has a semicircular arc shape.

12. The method for producing a semiconductor light emitting device according to claim 11, further comprising conducting inspection with a probe needle being in contact with said pad electrode after arranging said stopper member.

13. A semiconductor light emitting device comprising:
    a semiconductor layer portion;
    a pad electrode on the semiconductor layer portion;
    a protection film that covers at least said semiconductor layer portion, and
    at least one stopper member that is arranged on a peripheral part of an upper surface of said pad electrode and is spaced away from said protection film,
    wherein said stopper member is formed of the same materials as said protection film.

14. A semiconductor light emitting device comprising:
    a semiconductor layer portion;
    a pad electrode on the semiconductor layer portion;
    a protection film that covers at least said semiconductor layer portion, and
    at least one stopper member that is arranged on a peripheral part of an upper surface of said pad electrode and is spaced away from said protection film,
    wherein said stopper member has substantially the same height as said protection film.

15. A method for producing a semiconductor light emitting device, the method comprising:
    depositing a semiconductor layer portion on a substrate;
    arranging a pad electrode on a part of said semiconductor layer portion;
    arranging a protection film that covers said semiconductor layer portion; and
    arranging a stopper member on a peripheral part of an upper surface of said pad electrode with the stopper member protruding from the surface of said pad electrode,
    wherein said stopper member is formed of the same materials as said protection film.

* * * * *